| United States Patent [19] | [11] Patent Number: 4,922,318 |
|---|---|
| Thomas et al. | [45] Date of Patent: May 1, 1990 |

[54] BIPOLAR AND MOS DEVICES FABRICATED ON SAME INTEGRATED CIRCUIT SUBSTRATE

[75] Inventors: Mammen Thomas, San Jose; Matthew Weinberg, Mountain View, both of Calif.

[73] Assignee: Advanced Micro Devices, Inc., Sunnyvale, Calif.

[21] Appl. No.: 777,149

[22] Filed: Sep. 18, 1985

[51] Int. Cl.$^5$ .................... H01L 27/02; H01L 29/04; H01L 27/12; H01L 23/48

[52] U.S. Cl. ........................................ 357/43; 357/42; 357/49; 357/59; 357/71

[58] Field of Search ................... 357/43, 59 H, 42, 49, 357/59 I, 6, 71 S

[56] References Cited

U.S. PATENT DOCUMENTS

| 4,128,845 | 12/1978 | Sakai | 357/51 |
|---|---|---|---|
| 4,477,310 | 10/1984 | Park et al. | 156/643 |
| 4,541,169 | 9/1985 | Bartush | 357/49 |
| 4,583,106 | 4/1986 | Anantha et al. | 357/35 |
| 4,597,827 | 7/1986 | Nishitani et al. | 156/643 |
| 4,599,136 | 7/1986 | Araps et al. | 357/49 |
| 4,621,276 | 11/1986 | Malhi | 357/42 |

FOREIGN PATENT DOCUMENTS 0139266 5/1985 European Pat. Off. .

Primary Examiner—Andrew J. James
Assistant Examiner—Ngan Van Ngo
Attorney, Agent, or Firm—John P. Taylor

[57] ABSTRACT

An improved integrated circuit structure is disclosed comprising bipolar and MOS devices formed on the same substrate. The bipolar devices have at least the emitter and the collector contact portions formed from a polysilicon layer which results in raised contacts. The MOS devices are similarly formed with raised gate contact portions formed from the same polysilicon layer. Metal silicide is formed over at least a portion of the base, source, and drain regions to provide conductive paths to the base, source, and drain contacts. In one embodiment, the base, source, and drain contacts are also formed from the same polysilicon layer to permit formation of a highly planarized structure with self-aligned contacts formed by planarizing an insulating layer formed over the structure sufficiently to expose the upper surface of the contacts.

1 Claim, 16 Drawing Sheets

BIPOLAR AND MOS DEVICES FABRICATED ON SAME INTEGRATED CIRCUIT SUBSTRATE

BACKGROUND OF THE INVENTION

1. Field of the Invention

This invention relates to the fabrication of bipolar and MOS devices on an integrated circuit substrate. More particularly, this invention relates to the production of a fast bipolar transistor and an at least one MOS transistor on the same substrate using raised polysilicon contacts for at least some of the electrodes.

2. Description of the Prior Art

In the construction of integrated circuits, the active devices usually comprises either bipolar or MOS type devices. Bipolar devices may be chosen instead of MOS due to their high current carrying characteristics and superior transconductance of the devices. On the other hand, the use of MOS devices, in preference to bipolar devices, usually occurs when either the low power consumption or high density characteristics of MOS devices are needed or desired.

In many instances, it would be most desirable to use both types of devices in an integrated circuit structure to achieve certain desired effects, e.g., fast logic and low power storage. However, this may be difficult due to the differences in the techniques which have evolved to construct bipolar and MOS devices; particularly when such techniques may be addressed toward remedying a problem which is peculiar to one particular device.

For example, in the construction of bipolar devices, the spacing between the emitter and the base contact in prior art bipolar transistors is defined by lithography and isolated by oxide. This makes it necessary to have a high dose implanted or diffused extrinsic base region under the oxide which acts as the interconnect between the intrinsic base and the base contact. This high doping of the extrinsic base region results in unacceptable increases in capacitance between the base and the buried collector. This problem becomes particularly acute when the thickness of the epitaxial layer between the base and the buried collector is reduced for improved performance which results in the base butting against the buried collector layer to thereby raise the capacitance and slow down the speed of the device.

Furthermore, since the resistance of the doped extrinsic base region still does not approach the conductivity of polysilicon or metal, the minimum base resistance of the extrinsic base region, i.e., the resistance of the extrinsic base between the intrinsic base and the base contact, is always a factor degrading performance of such a device.

Another problem in prior art bipolar devices which adversely impacted the speed of such devices was the side diffusion of the highly doped extrinsic base into the emitter which reduced the emitter area and thereby prevented shrinking of the emitter area which would other wise be desirable to improve performance of the device by reducing the capacitance between the emitter and the intrinsic base beneath the emitter. Furthermore, in conventional emitter construction, sidewall capacitance cannot be reduced to gain performance improvement.

Conventional construction of single crystal emitters further limits the gain of the device as well as reducing the ability to provide a shallow emitter without incurring problems of reverse injection of carriers from base to emitter.

In our prior U.S. patent application Ser. No. 747,517, filed June 21, 1985, and entitled FAST BIPOLAR TRANSISTOR FOR INTEGRATED CIRCUIT STRUCTURE AND METHOD OF MAKING SAME, cross reference to which is hereby made, we described and claimed a structure having a raised polysilicon emitter contact with oxide spacers on the sidewalls and a metal silicide conductive path on the surface between the base contact and a point adjacent the oxide spacer to provide a faster device with higher gain and lower capacitance and resistance.

MOS devices are usually constructed in a non planarized fashion with steps created when making contact with the source and drain regions which are lower than the gate region. Also, despite the high density of the MOS devices, the gate contact usually occupies a large area due to the need to make the contact in a position offset to the gate region because of alignment problems.

Furthermore, in the construction of MOS devices, the source and drain junctions may be formed too deep causing the junctions to sometimes extend under the gate region causing overlap capacitance which degrades the performance of the device. The extension of the junction under the gate may be caused by forming the junction too deeply in the substrate. This can also cause the depletion region to extend sideways into the channel causing a short channel effect which further degrades the performance and functionality as well as long term reliability. If the source and drain regions can be formed as shallow junctions, which do not extend laterally, e.g., beneath the gate, the junction capacitance may also be lowered because of the reduction in the junction area.

It would, therefore, be very desirable to be able to fabricate both bipolar and MOS devices on the same substrate; preferably in a manner which would address the problems of each of the particular devices discussed above.

SUMMARY OF THE INVENTION

It is therefore an object of this invention to provide an improved integrated circuit structure containing both bipolar and MOS devices characterized by fast operation, low power consumption, and low capacitance and a method of making same.

It is another object of this invention to provide an improved integrated circuit structure containing both bipolar and MOS devices having at least some of the electrode contacts formed using polysilicon with self-aligned contacts.

It is yet another object of this invention to provide an improved integrated circuit structure containing both bipolar and MOS devices having a metal silicide layer over a portion of at least some of the electrode contacts to lower the base resistance of the bipolar device and raise the current carrying capability of the MOS device.

It is a further object of this invention to provide an improved integrated circuit structure containing both bipolar and MOS devices and having oxide spacers formed adjacent the sidewalls of the raised polysilicon emitter and gate electrodes.

It is yet a further object of this invention to provide an improved integrated circuit structure containing both bipolar and MOS devices using planarization techniques to provide separate contacts to the electrodes of the devices.

It is a still further object of this invention to provide an improved integrated circuit structure containing both bipolar and MOS devices having a raised polysilicon base, source, and drain contacts which may be opened simultaneously with the opening of the emitter, gate, and collector contacts to eliminate step to the base, source, and drain contacts.

These and other objects of the invention will become apparent from the following description and accompanying drawings.

In accordance with the invention, an improved integrated circuit structure is provided comprising a bipolar device having a polysilicon emitter formed over a base region of a silicon substrate with oxide spacer portions formed on the sides of the emitter and an MOS device having a polysilicon gate with oxide spacer portions formed on the sides of the gate.

DESCRIPTION OF THE INVENTION

Figure 1:
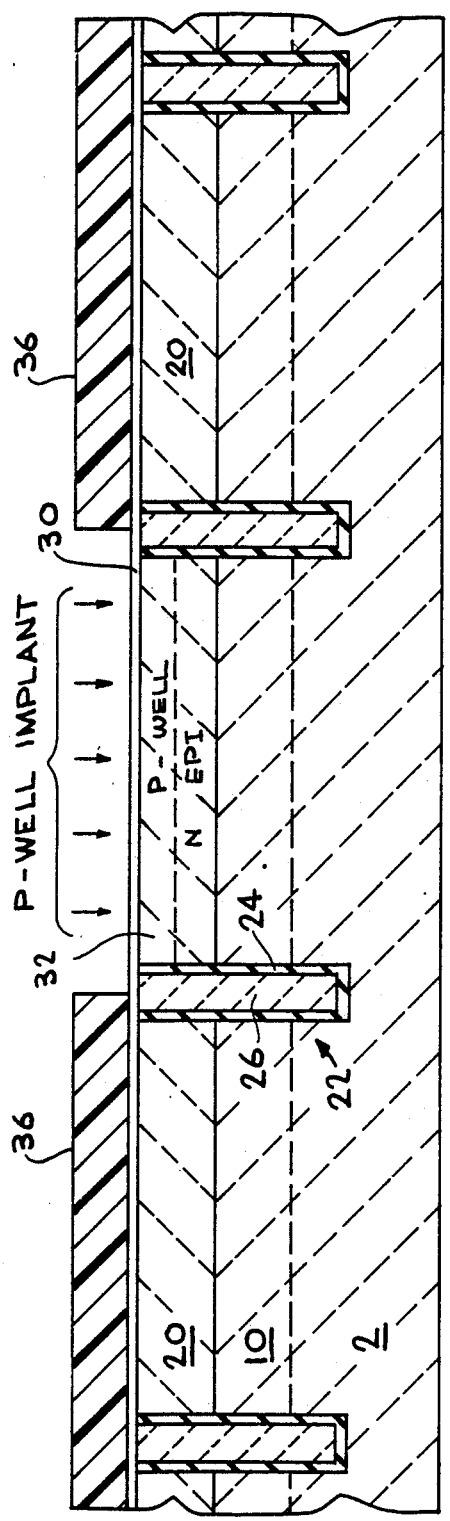
FIG. 1 is a fragmentary vertical cross-sectional view of an integrated circuit structure illustrating an early stage of the construction of the improved integrated circuit structure of the invention.

Referring now to FIG. 1, a buried N+ collector 10 is shown as already formed in P type silicon substrate 2 with an N epitaxial silicon layer 20 grown over buried collector 10 and a thin buffer layer 30 of oxide, e.g., about 300 Angstroms, applied over epitaxial layer 20. Buried layer 10 may extend over the entire substrate as shown, or may be formed only in the bipolar region by appropriate masking. Isolation slots 22 may then be formed which extend down from the surface through epitaxial layer 20 and buried layer 10 into substrate 2. Slots 22 may be lined with an isolation oxide 24 and then filled at 26 with polysilicon. The areas in which will be formed the bipolar and PMOS devices are then masked at 36, e.g., with a photoresist mask, to permit P implantation into the N epitaxial layer 20 to form P well 32.

It should be noted here, that while a slot type of isolation is illustrated here, other forms of isolation such as isoplanar or junction isolation may also be used in connection with the practice of this invention.

Figure 2:
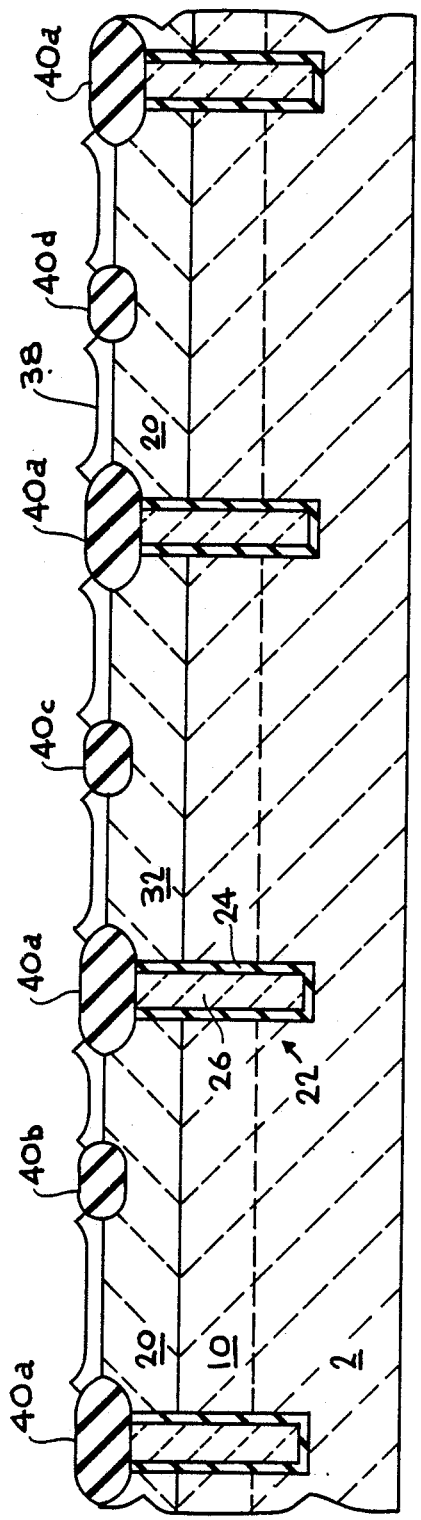
FIGS. 2-10 are fragmentary vertical cross-sectional views illustrating subsequent stages of the construction of one embodiment of the improved integrated circuit structure of the invention.

P well mask 36 is then removed and epitaxial layer 20 is covered with a nitride layer 38, as shown in FIG. 2, which is then appropriately masked to permit growth of field oxide isolation areas 40a, 40b, 40c, and 40d. Field oxide areas 40a are formed over slots 22 and cooperate with the slots to separate adjacent devices of different types, e.g., to separate bipolar from PMOS, and PMOS from NMOS. Field oxide 40b serves to separate the base contact of the bipolar device from the collector contact. Field oxide 40c separates adjacent NMOS devices and field oxide 40d separates adjacent PMOS devices.

Figure 3:
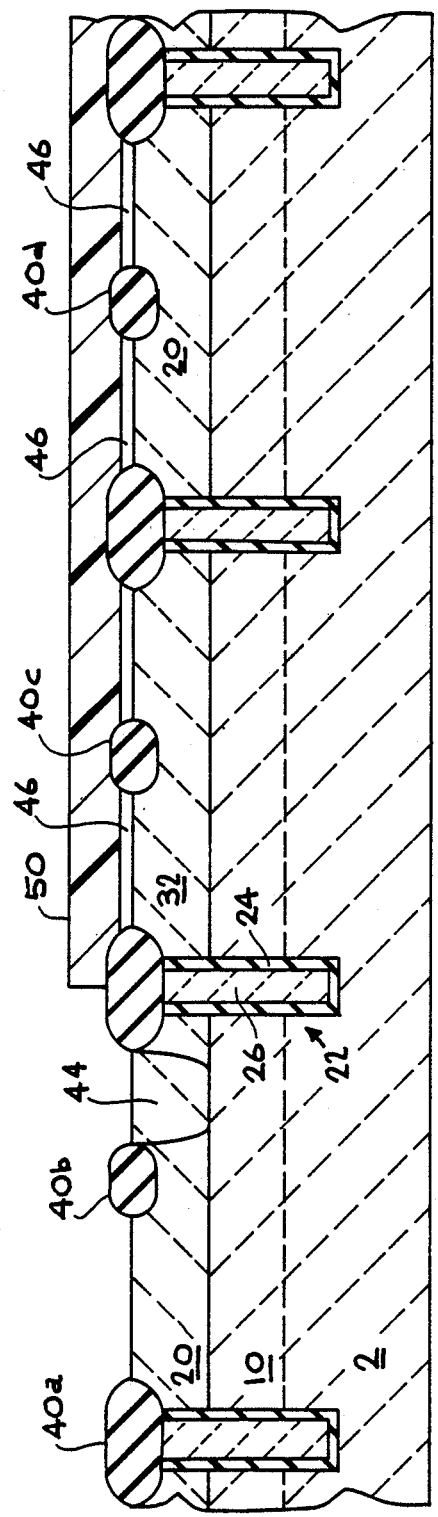

Nitride layer 38 is then masked to open up sinker 44 as shown in FIG. 3 which is then formed by an N+ implantation to form the N+ sinker which will provide the connection to buried collector layer 10.

After formation of sinker 44, nitride layer 38 is stripped off. A gate oxide layer 46 is then formed on the surface of epitaxial layer 20 which is partially removed by masking the MOS areas with photoresist mask 50 to permit removal of gate oxide layer 46 from the bipolar regions of the structure.

Figure 4:
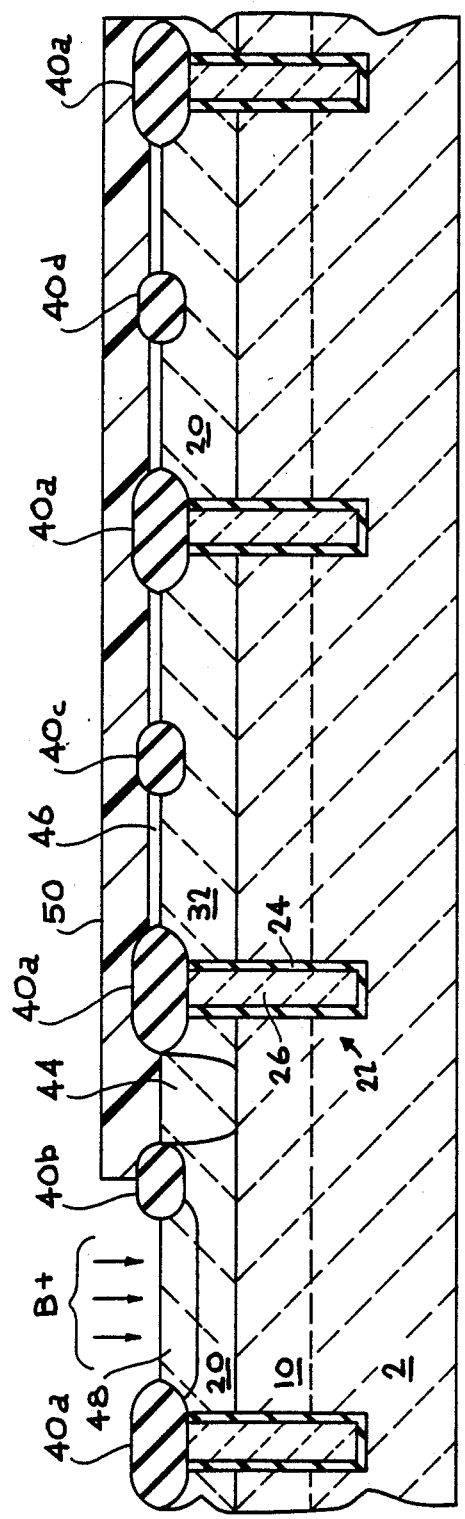

After removal of the gate oxide layer 46 in the bipolar region, the surface of sinker 44 is also masked and the remainder of the bipolar region is doped, e.g., by a P+ implantation, with boron, to form a P doped intrinsic base region 48 as shown in FIG. 4. Alternatively, the P+ implantation may be done before the gate oxide is stripped in the bipolar region.

Figure 5:
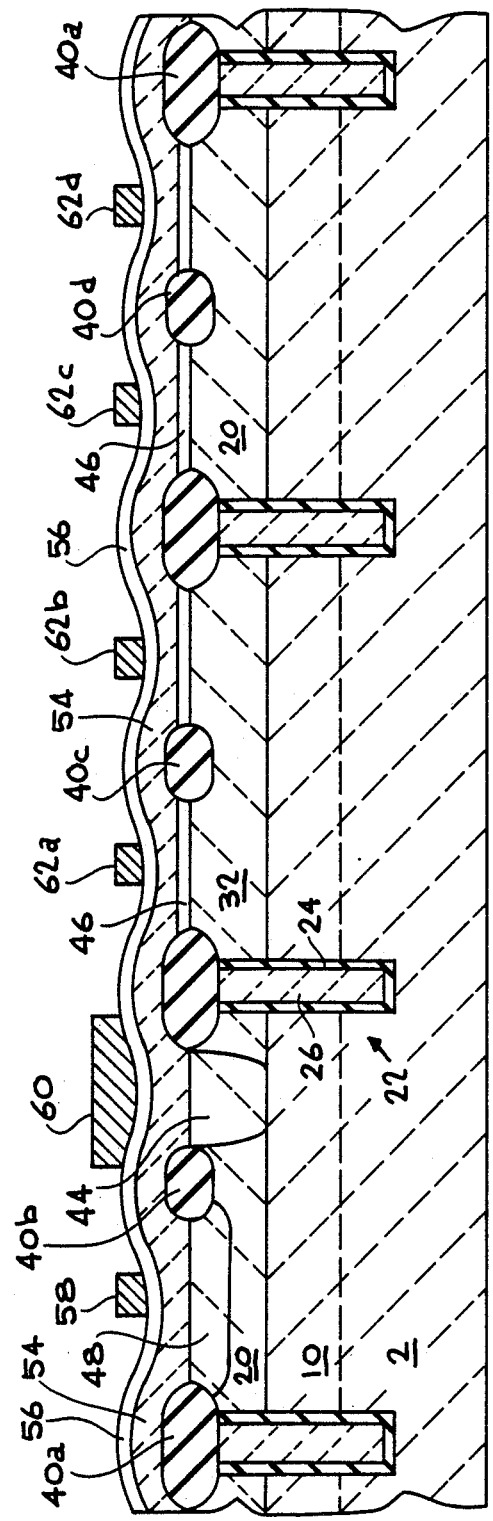

As shown in FIG. 5, mask 50 is then removed and a 3000-5000 angstrom polysilicon layer 54 is formed over the entire surface followed by application of a nitride layer 56 thereover. Polysilicon layer 54 is doped with an N dopant, such as, for example, a $POCl_3$ diffusion or an Arsenic+ implant, to form an N+ layer. In one embodiment of the invention, polysilicon layer 54, and nitride layer 56 thereon, are then masked to define the emitter at 58, the collector at 60 and the gates at 62a, 62b, 62c, and 62d. The remainder of polysilicon layer 54 is then plasma etched away leaving raised polysilicon emitter contact 70, raised polysilicon collector contact 74, and raised polysilicon gate contacts 80a, 80b, 80c, and 80d.

The now exposed gate oxide 46 over the source and drain regions may now be removed using an etchant such as, for example, a $NH_3$-Acetic acid etch. A 300 Angstrom protective layer of oxide 66 is then grown on the now exposed sides of the polysilicon contacts 70, 74, 80a, 80b, 80c, and 80d with the remainder of nitride layer 56 providing a mask for the top surfaces of the raised contacts. The heat used for this growth, i.e., about 1000° C. for about 10-20 minutes, also serves to lightly diffuse doped emitter contact 70 into intrinsic base region 48 to form emitter region 72 in intrinsic base region 48.

Figure 6:
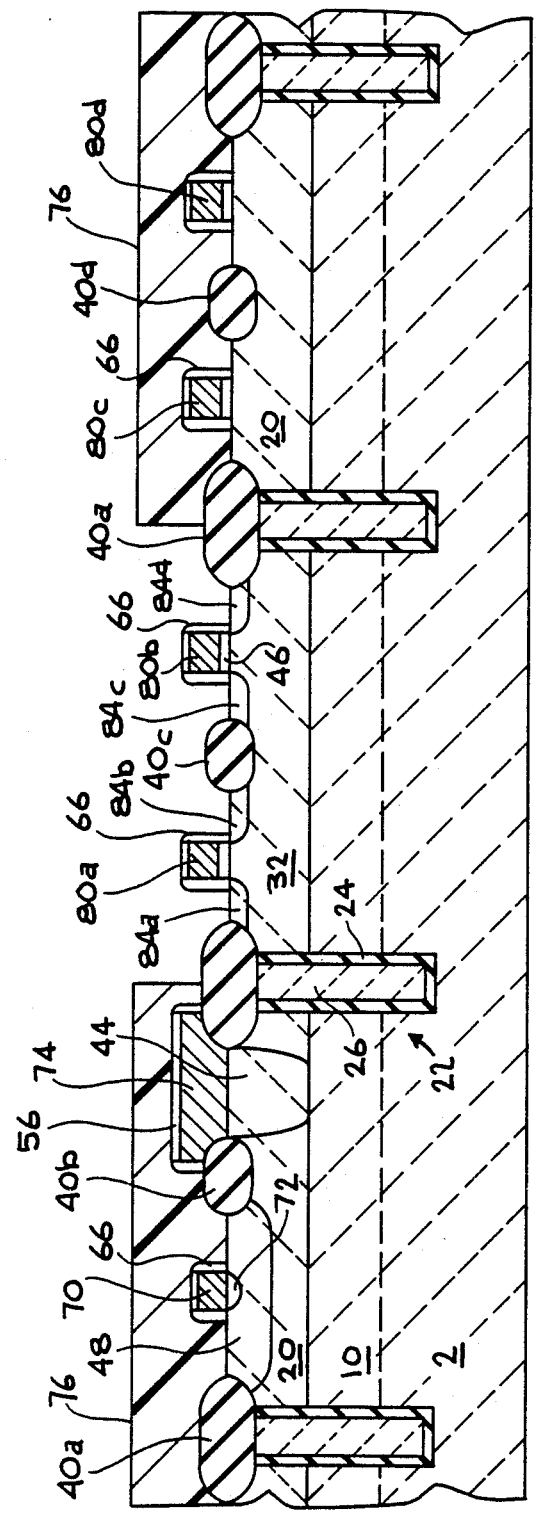

The bipolar and PMOS regions are then masked with a photoresist mask 76 and lightly doped (LDD) source and drains regions 84a, 84b, 84c, and 84d are formed in P well 32 in the NMOS region by an N-implant as shown in FIG. 6.

Figure 7:
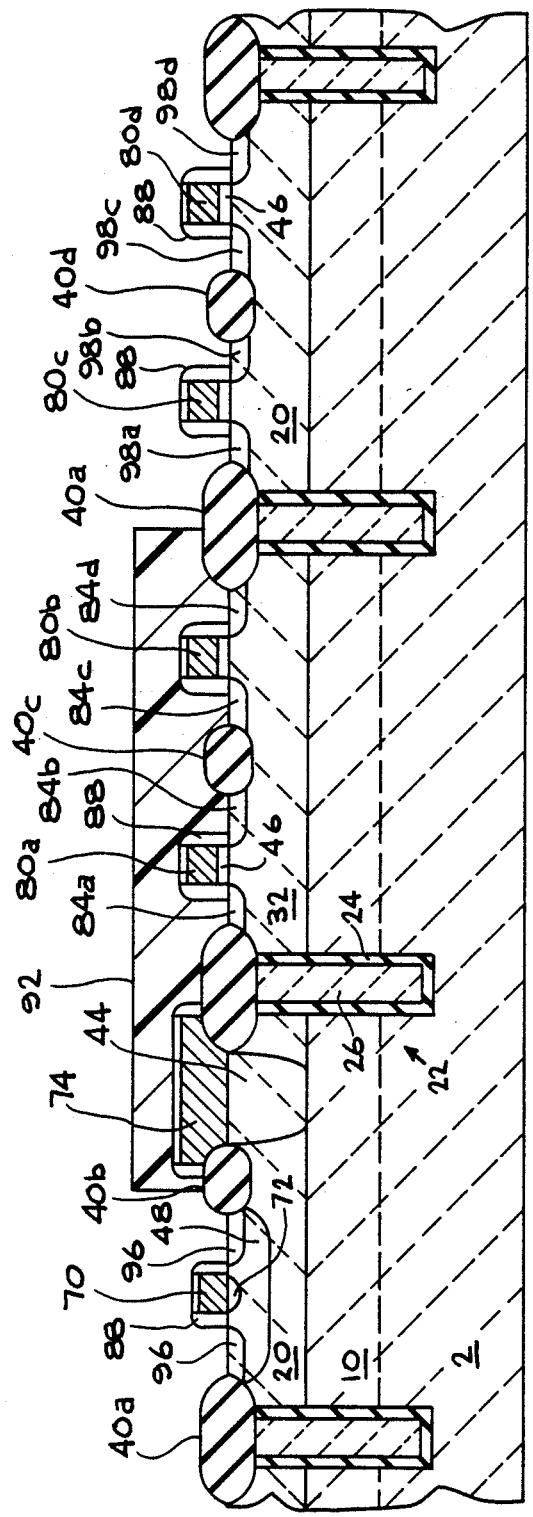

Turning now to FIG. 7, photoresist mask 76 is now removed and a layer of oxide, from which will be formed the oxide spacers, is then formed over the structure. This oxide is then subjected to a reactive ion etch (RIE) to remove most of the oxide leaving only oxide spacer portions 88 on the sides of the raised polysilicon contacts 70, 74, 80a, 80b, 80c, and 80d. Alternatively, spacers 88 may be grown by differential oxidation wherein the oxide will grow faster on the doped polysilicon comprising raised contacts 70, 74, and 80a-80d than on epitaxial layer 20. Alternatively, spacer 88 may comprise other insulating materials such as nitride.

The NMOS region and the collector contact of the bipolar device are then masked with photoresist 92. A P+ implant, using, for example, $BF_2$, is then made to provide a P+ extrinsic base region 96 in P base 48 on each side of emitter contact 70 in the bipolar region; and to provide source and drain regions 98a, 98b, 98c, and 98d in epitaxial layer 20 in the PMOS region as illustrated in FIG. 7.

Figure 8:
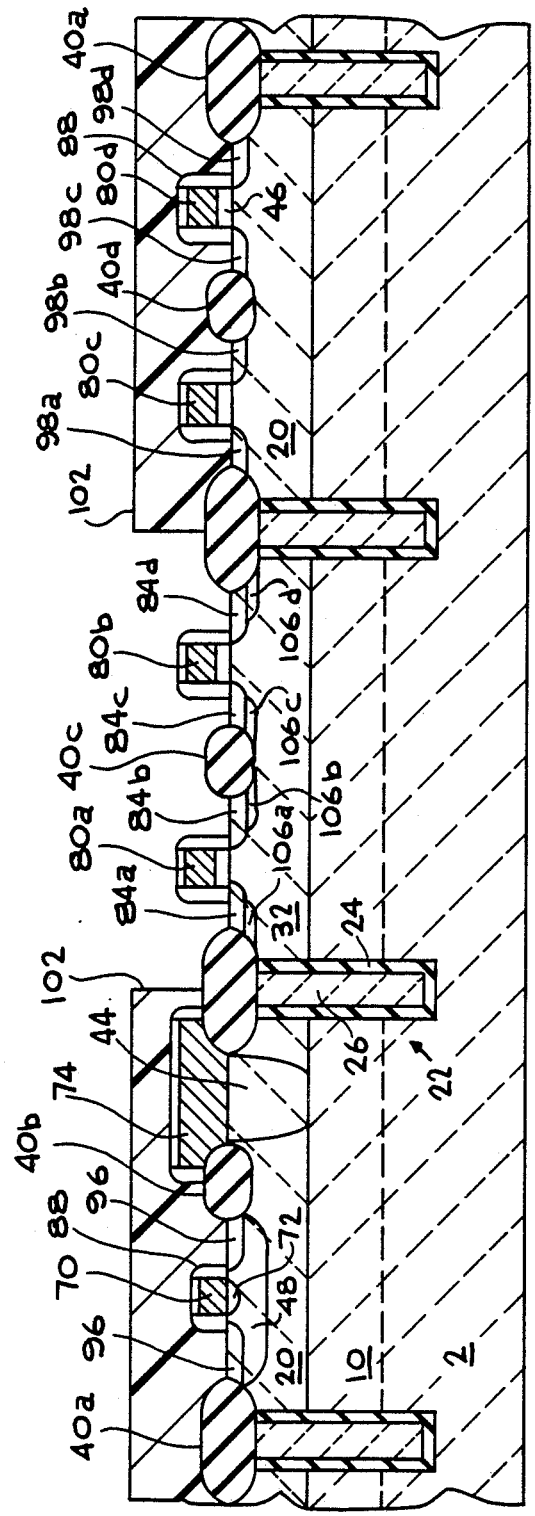

The bipolar and PMOS regions are then masked with photoresist mask 102, as shown in FIG. 8, and N+ source and drain regions 106a, 106b, 106c, and 106d are then implanted with arsenic. Photoresist mask 102 is then stripped and an implant anneal is performed, e.g., at 1000° C. for 10 minutes, or by a "rapid thermal anneal".

Figure 9:
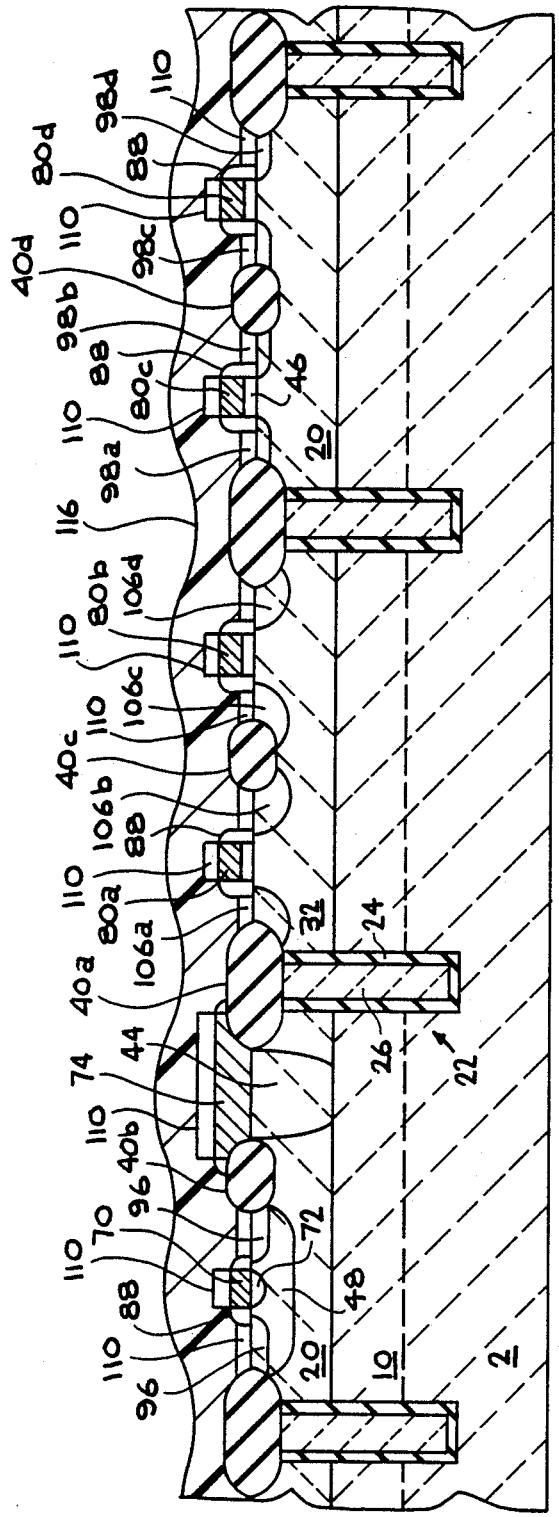

The remaining nitride on the raised emitter, collector, and gate contacts is then stripped and a metal, capable of forming a silicide, such as, for example, platinum, or titanium, is deposited to form metal silicide layer 110 over the respective emitter, collector, and gate contacts as shown in FIG. 9.

Planarization layer 116 is then applied over the structure and planarized to clear the respective emitter, collector and gate contacts, i.e., to expose the metal silicide coating 110 on the upper surface of the contacts also shown in FIG. 9. Planarization layer 116 may comprise an oxide, a nitride, or a polyimide, or any combination thereof, or any other insulation material.

Figure 10:
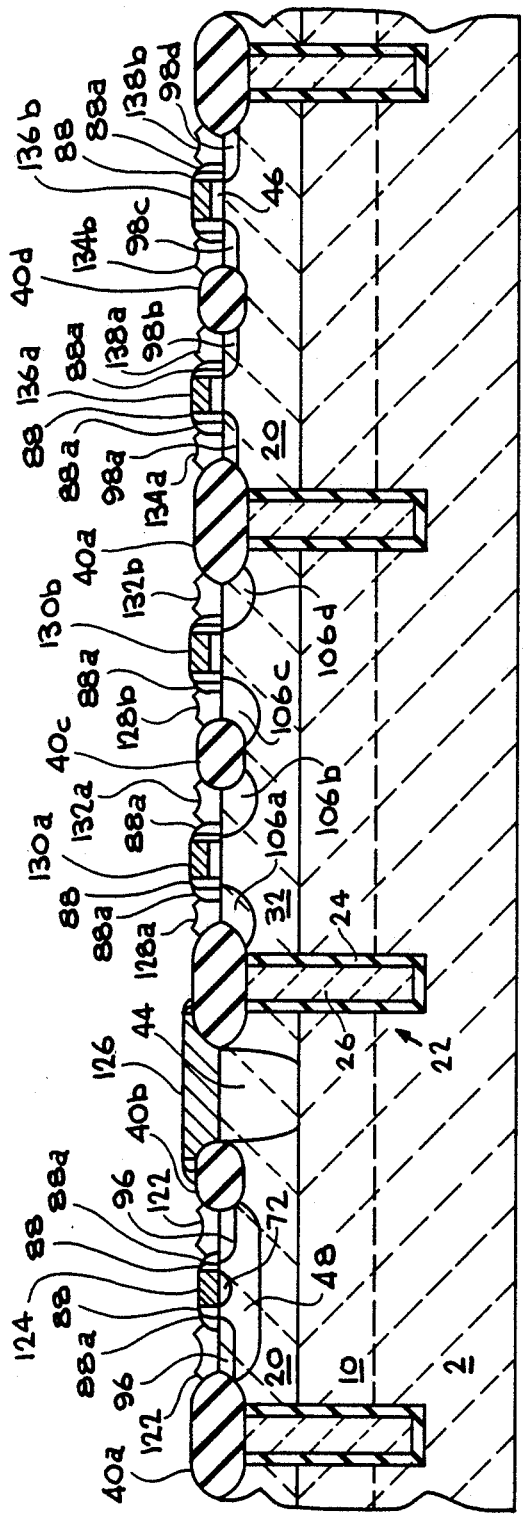

The structure is then blanket etched, as shown in FIG. 10, to clear the base, source, and drain contacts. When planarization layer 116 is etched in this manner, additional spacer members 88a, comprising remnants of planarization layer 116, are left adjacent spacers 88, as further shown in FIG. 10. Spacers 88a act in conjunction with spacers 88 to separate the contacts from one another. Alternatively, these contacts may be "cut" by opening vias onto the silicide. A metal layer, e.g., a 0.8 micron layer of aluminum over a barrier layer of TiW, is then deposited over the structure and masked to provide metal contacts 122, 124, and 126 in the bipolar region; source contacts 128a and 128b, gate contacts 130a and 130b, and drain contacts 132a and 132b in the NMOS region; and source contacts 134a and 134b, gate contacts 136a and 136b, and drain contacts 138a and 138b in the PMOS region.

The foregoing describes one embodiment of the invention wherein the use of oxide spacers on the sides of both the emitter and the gate, coupled with the removal of the gate oxide over the source and drain, and the use of metal silicide over the contacts provides a more compact structure with self aligned contacts.

However, in yet another embodiment, as will be explained below, the techniques described may be also used to provide a structure which is highly planarized due to the provision of all raised polysilicon contacts, i.e., raised base, source, and drain contacts as well as the raised emitter, collector, and gate contacts just described.

Figure 11:
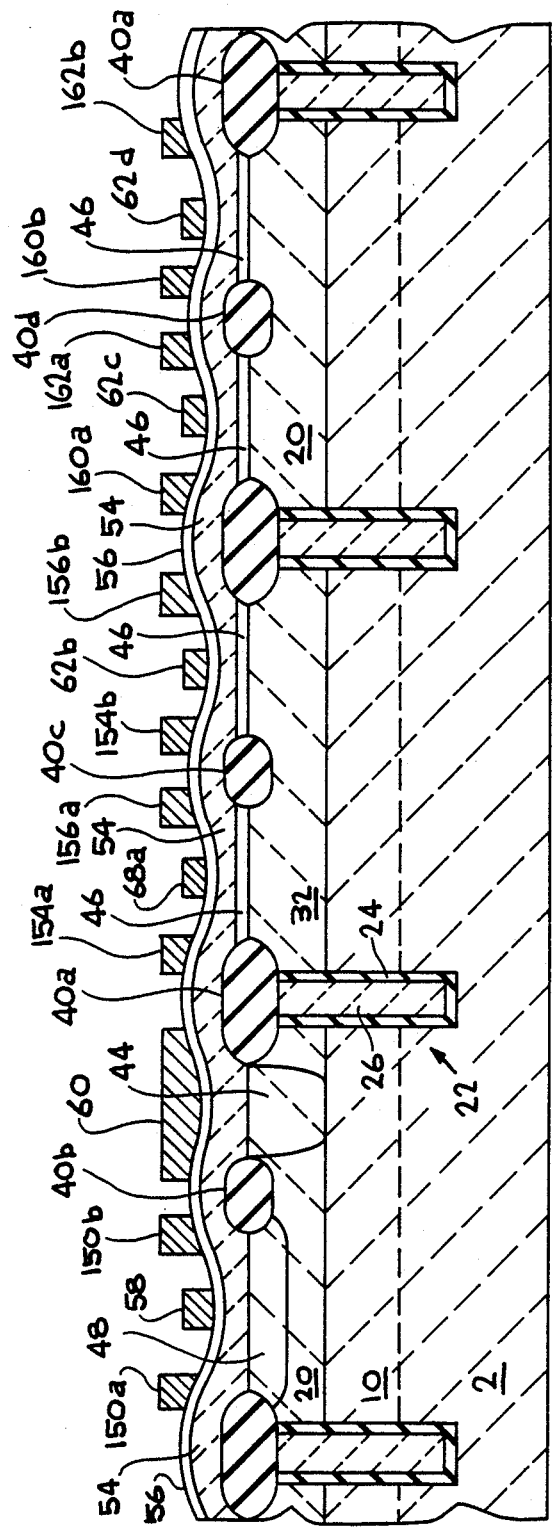
FIGS. 11-16 are fragmentary vertical cross-sectional views illustrating subsequent stages of the construction of another embodiment of the improved integrated circuit structure of the invention.

Turning now to FIG. 11, the structure previously described in FIGS. 1-4, is masked somewhat differently from the mask of FIG. 5 in the previous embodiment in that base masks 150a and 150b are also provided as well as NMOS source masks 154a and 154b, NMOS drain masks 156a and 156b, PMOS source masks 160a and 160b, and PMOS drain masks 162a and 162b.

Figure 12:
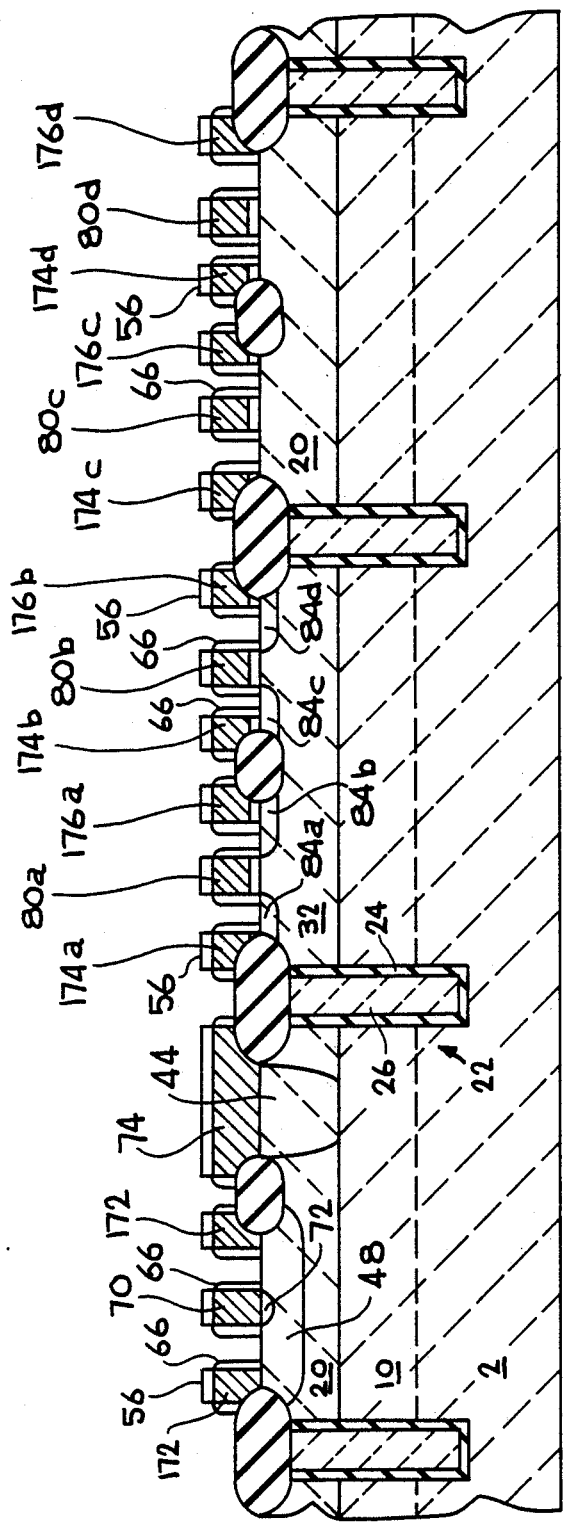

The remainder of the polysilicon is then removed as well as the underlying nitride layer as in the previously described embodiment leaving a raised polysilicon base contact 172, raised polysilicon emitter contact 70, raised polysilicon collector contact 74, raised polysilicon source contacts 174a-174d, raised polysilicon gate contacts 80a-80d, and raised polysilicon drain contacts 176a-176d as shown in FIG. 12.

At this point the exposed portions of gate oxide layer 46 over the source and drain regions (in between the raised polysilicon source and gate contacts or in between the raised polysilicon gate and drain contacts) may be removed.

Figure 13:
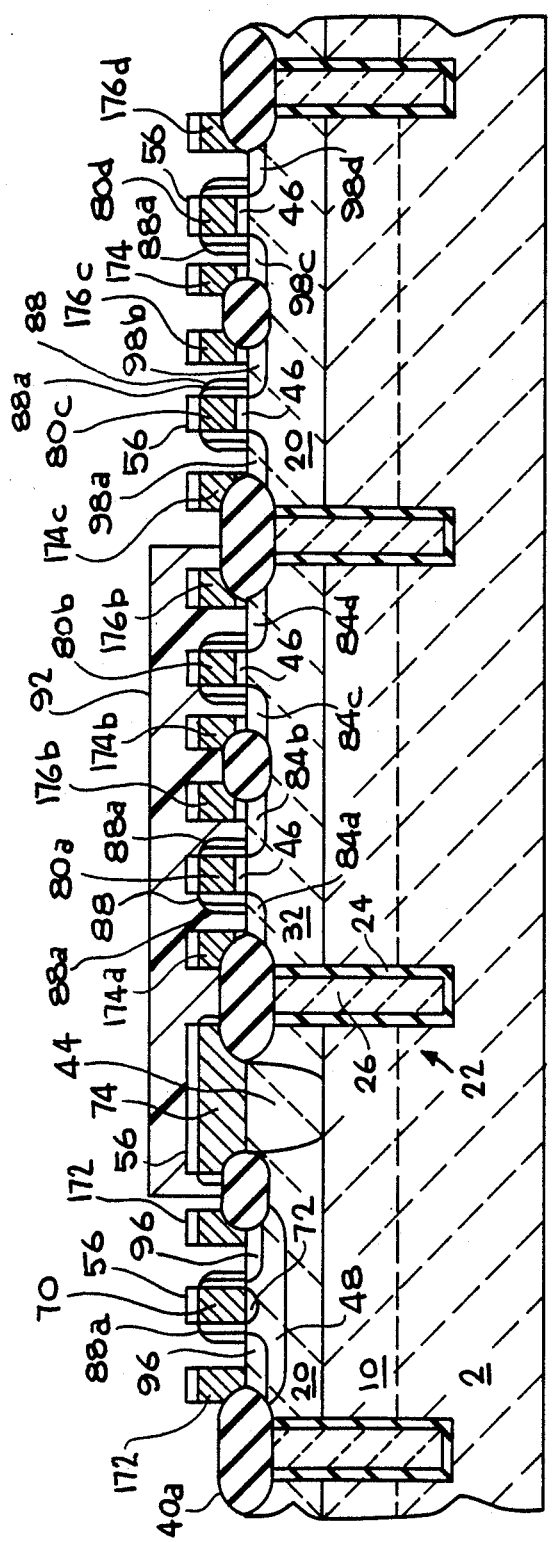
Figure 14:
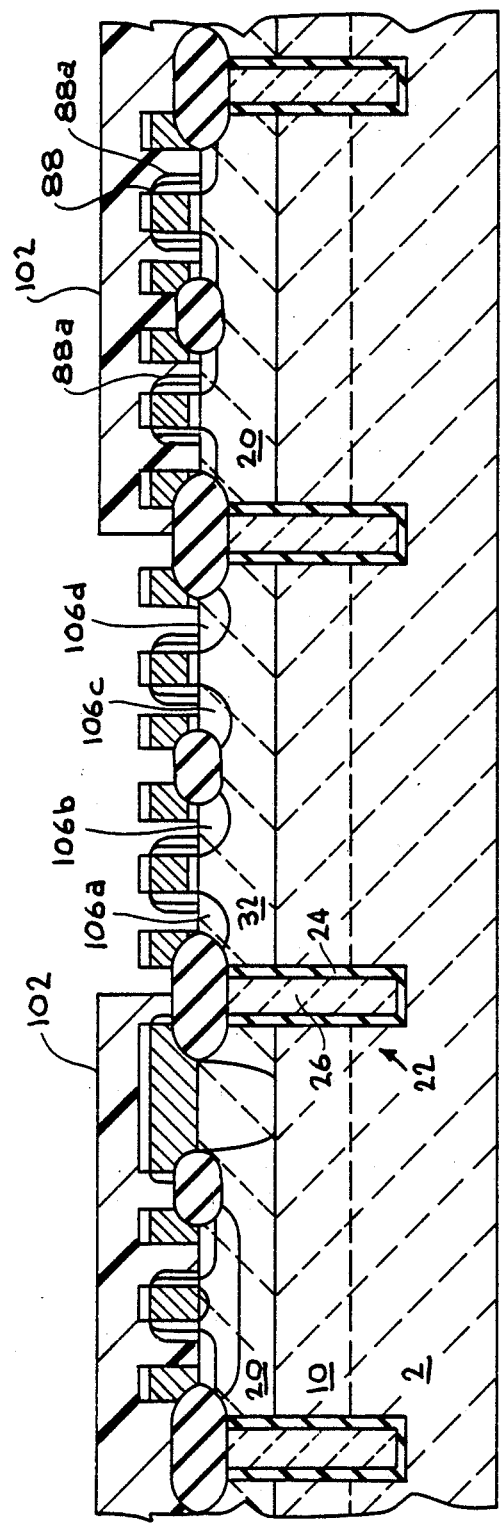
Figure 15:
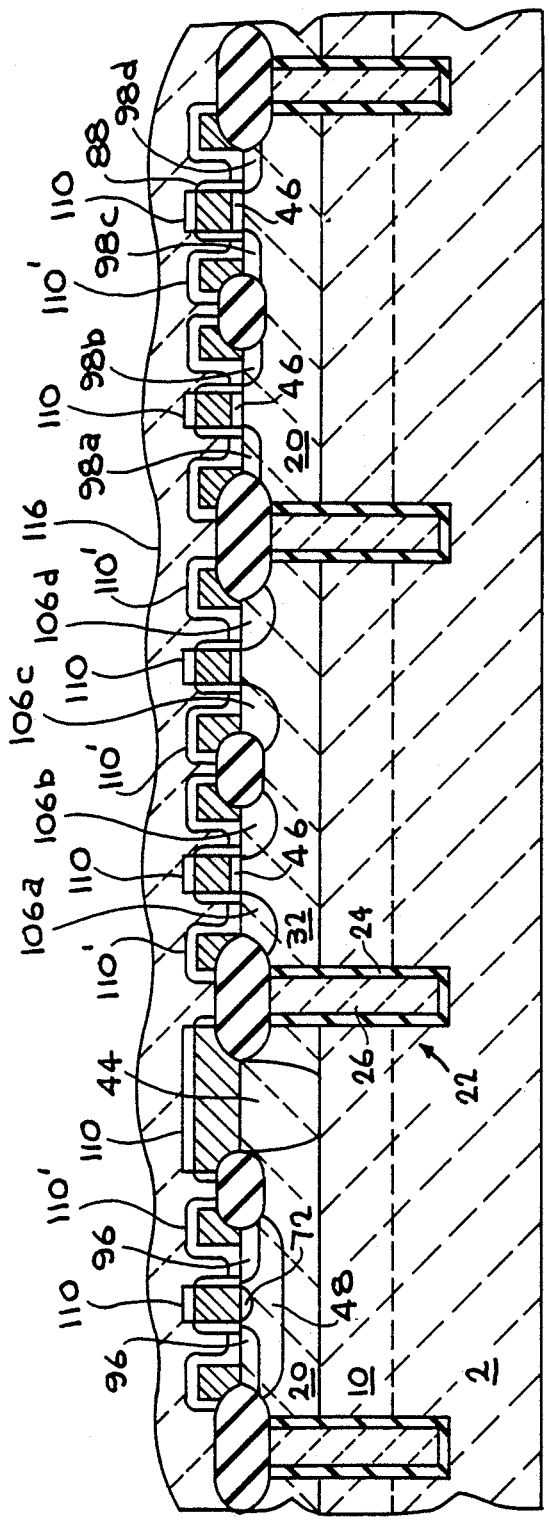

The resultant structure is then processed in FIGS. 13-15 in similar fashion to the process steps described and illustrated in FIGS. 7-9 to form oxide spacers 88 on the sidewalls of the raised polysilicon contacts. However, as shown in FIGS. 13 and 14, since all of the contacts are now raised in this embodiment, the oxide spacers, formed on the sides of the raised base, source and drain contacts, are removed prior to the implantation steps by appropriate masking of the emitter, collector, and gate regions. The respective areas in FIGS. 13 and 14 are then masked in similar fashion to that shown for FIGS. 7 and 8 to form the respective source and drain implants in the PMOS and NMOS regions as well as the P+ base implantation in the bipolar region.

The silicide step then forms a conductive coating or layer of silicide 110' on the top and sides of the raised polysilicon base, source, and drain contacts as well as over the extrinsic base region 96 and over the source and drain regions to provide low resistance current paths to the respective raised electrode contacts as shown in FIG. 15.

As in the previous embodiment shown in FIG. 9, a layer of oxide 116 is then formed over the structure after the siliciding step as also seen in FIG. 15. However, unlike the prior embodiment, subsequent planarization opens all the contacts making further selective etching to clear the base, source, and drain contacts unnecessary.

Figure 16:
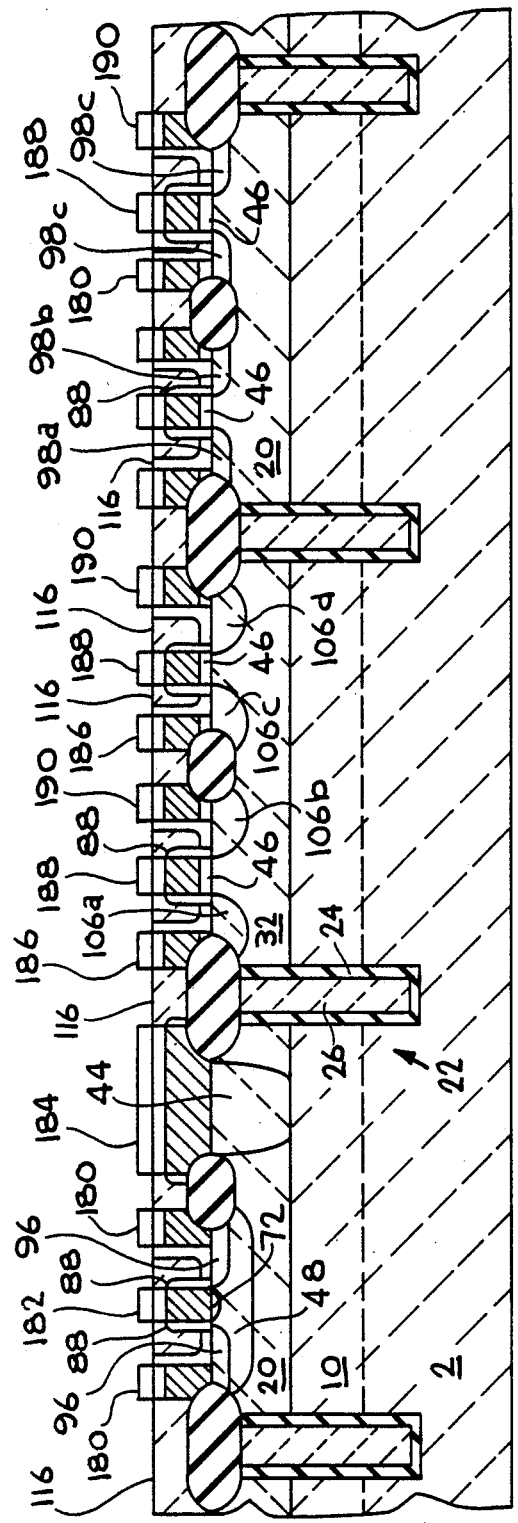

The final metallization and masking steps then form metal base contact 180, metal emitter contact 182, metal collector contact 184, metal source contacts 186, metal gate contacts 188, and metal drain contacts 190. The resultant structure, as seen in FIG. 16, is a highly planarized structure with all self aligned contacts.

The resulting integrated circuit structure comprises a combination of bipolar and MOS devices wherein the bipolar devices operate faster due to the low resistance between the intrinsic base and the base contact with high base resistance only under the emitter and oxide spacers since the remainder of the base is in contact with the metal silicide, thus effectively eliminating the relatively high resistance and high collector-base capacitance of the extrinsic base regions of prior art devices. The use of polysilicon emitters also results in a device having higher gain by preventing reverse injection of minority carriers from the base to the emitter.

Furthermore, the invention provides an improved construction of the MOS devices which facilitates the formation of contacts thereto without cutting through the passivation glass to reach the source and drain regions thereby eliminating the critical alignment and process tolerance associated with via contacts. The gate resistance is lowered by using a polysilicon gate with direct contact to the gate polysilicon over the channel instead of bringing the contact to the side of the channel. In addition, the use of self aligned contacts permits a more compact construction by eliminating the need for protective oxides around cut areas.

Finally, the use of all raised polysilicon electrode contacts with metal silicide conductive paths thereon, in one embodiment of the invention, results in the provision of a very planarized structure possessing high speed and low resistance and capacitance.

Having thus described the invention, what is claimed is:

1. An improved integrated circuit structure having one or more bipolar devices formed therein and one or more MOS devices formed therein comprising:

(a) a P type silicon substrate having an N+ buried layer formed therein, an N type epitaxial silicon layer grown over said buried layer, and oxide isolation regions formed in said epitaxial layer and extending into said structure sufficiently to provide isolation between adjacent devices and between the collector region and the base/emitter region of said one or more bipolar devices formed therein;

(b) an intrinsic base region formed in said epitaxial layer;

(c) a raised emitter contact on said epitaxial layer over said intrinsic base region and constructed using polysilicon to provide high gain;

(d) an emitter region formed in the surface of said intrinsic base region by diffusing dopant from said raised polysilicon emitter contact into said intrinsic base region;

(e) oxide spacer means on the sidewall of said raised polysilicon emitter contact;

(f) a polysilicon collector contact on said epitaxial layer raised to approximately the same level as said raised polysilicon emitter contact and separated from said intrinsic base region by one of said isolation oxide regions and in electrical communication with said buried layer through sinker means in said epitaxial layer;

(g) a polysilicon base contact on said epitaxial layer raised to approximately the same level as said raised polysilicon emitter contact;

(h) a first metal silicide conductive layer formed on said epitaxial layer over at least a portion of said intrinsic base region and over the top and sides of said raised polysilicon base contact to thereby provide a horizontal conductive path extending from said oxide spacer means on said raised polysilicon emitter contact to said raised polysilicon base contact and a vertical conductive path from said horizontal conductive path up the sides of said raised polysilicon base contact to the metal silicide on the top of said raised polysilicon base contact, whereby the speed of said device is enhanced by decreasing the resistance of the horizontal and vertical conductive paths between the intrinsic base under said emitter and the metal silicide on the top of said raised polysilicon base contact to which metal contact will subsequently be formed;

(i) a polysilicon gate having a raised contact portion formed over a gate oxide layer on said epitaxial layer overlying a channel region formed in said epitaxial layer;

(j) oxide spacer means on the sidewall of said raised gate contact portion;

(k) source and drain regions formed in said epitaxial layer contiguous with said channel region and separated from adjacent devices in said structure by said isolation oxide regions;

(l) polysilicon source and drain contacts on said epitaxial layer raised to approximately the same level as said raised polysilicon gate contact;

(m) second metal silicide conductive layer portions respectively overlying said source and drain regions in said epitaxial layer and over the sides and tops of said raised polysilicon source and drain contacts to thereby provide horizontal conductive paths extending from said oxide spacer means on the sidewalls of said raised polysilicon gate contact to said raised polysilicon source and drain contacts, and vertical conductive paths from said respective horizontal conductive paths up the sides of said raised polysilicon source and drain contacts to decrease the resistance of the horizontal and vertical conductive paths respectively between the source and drain regions in said epitaxial layer and the metal silicide on the top of said raised polysilicon source and drain contacts to which metal contacts will subsequently be formed;

(n) a layer of insulating material over said structure which has been planarized to expose the upper surface of said raised base, emitter, collector, source, gate, and drain contacts;

whereby said structure comprises a highly planarized surface with self-aligned contacts and low resistance paths respectively between the tops of said raised base, source, and drain contacts and said base, source, and drain regions in said epitaxial layer.

* * * * *